United States Patent
Wang et al.

(10) Patent No.: US 11,885,008 B2
(45) Date of Patent: Jan. 30, 2024

(54) FILM FORMING APPARATUS AND METHOD FOR REDUCING ARCING

(71) Applicant: TAIWAN SEMICONDUCTOR MANUFACTURING COMPANY, LTD., Hsinchu (TW)

(72) Inventors: Po-Wei Wang, Taichung (TW); Chao-Hsing Lai, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/108,866

(22) Filed: Feb. 13, 2023

(65) Prior Publication Data
US 2023/0183855 A1 Jun. 15, 2023

Related U.S. Application Data

(63) Continuation of application No. 17/330,946, filed on May 26, 2021, now Pat. No. 11,578,402.

(51) Int. Cl.
*H01J 37/32* (2006.01)
*C23C 14/35* (2006.01)
(Continued)

(52) U.S. Cl.
CPC .......... *C23C 14/35* (2013.01); *C23C 14/0063* (2013.01); *C23C 14/3407* (2013.01);
(Continued)

(58) Field of Classification Search
CPC . C23C 14/35; C23C 14/0063; C23C 14/3407; C23C 14/50; H01J 37/3244; H01J 37/32449; H01J 37/3411
(Continued)

(56) References Cited

U.S. PATENT DOCUMENTS

| | | | |
|---|---|---|---|
| 5,340,459 | A | 8/1994 | Takehara |
| 6,030,509 | A | 2/2000 | Fu-Kang et al. |
| 6,179,974 | B1 | 1/2001 | Buchanan |

FOREIGN PATENT DOCUMENTS

| | | |
|---|---|---|
| CN | 109868456 | 6/2019 |
| JP | 11-061400 | 3/1999 |

(Continued)

OTHER PUBLICATIONS

Macine Translation KR 2008-0046956 (Year: 2008).*

*Primary Examiner* — Rodney G McDonald
(74) *Attorney, Agent, or Firm* — NZ CARR LAW OFFICE

(57) ABSTRACT

Embodiments of the present disclosure provide a substrate processing system. In one embodiment, the system includes a chamber, a target disposed within the chamber, a magnetron disposed proximate the target, a pedestal disposed within the chamber, and a first gas injector disposed at a sidewall of the chamber. The first gas injector includes a first gas channel extending through a body of the first gas injector, the first gas channel has a first gas outlet. The first gas injector also includes a second gas channel extending through the body of the first gas injector, wherein the second gas channel has a second gas outlet. The second gas channel includes a first portion, and a second portion branching off from an end of the first portion, wherein the second portion is disposed at an angle with respect to the first portion, and the first gas injector is operable to rotate about a longitudinal center axis of the body of the first gas injector.

20 Claims, 7 Drawing Sheets

(51) Int. Cl.
*C23C 14/00* (2006.01)
*C23C 14/34* (2006.01)
*C23C 14/50* (2006.01)
*H01J 37/34* (2006.01)

(52) U.S. Cl.
CPC .......... *C23C 14/50* (2013.01); *H01J 37/3244* (2013.01); *H01J 37/32449* (2013.01); *H01J 37/3411* (2013.01)

(58) Field of Classification Search
USPC .................................................. 204/298.07
See application file for complete search history.

(56) References Cited

FOREIGN PATENT DOCUMENTS

| | | | |
|---|---|---|---|
| JP | 2000-208298 | | 7/2000 |
| KR | 20080046956 | * | 5/2008 |
| TW | 202012700 | | 4/2020 |

* cited by examiner

FILM FORMING APPARATUS AND METHOD FOR REDUCING ARCING

CROSS-REFERENCE TO RELATED APPLICATIONS

This application is a continuation application of U.S. patent application Ser. No. 17/330,946 filed May 26, 2021, which is incorporated by reference in its entirety.

BACKGROUND

Physical vapor deposition (PVD) is a process used for deposition of materials atop a substrate. A conventional PVD process may include bombarding a target, which contains a source material to be deposited on the substrate, with ions from a plasma of an inert gas. This bombardment causes the source material to be sputtered from the target and deposited onto the substrate. During the PVD process, a magnetron may be rotated near a backside of the target to facilitate sputtering.

Arcing between the plasma and the substrate, chamber component, or target in the PVD process can cause significant substrate damage and defect contamination which limits wafer yields. Some PVD chambers may have a mechanism to interrupt the process when arcing is detected. However, such interruption reduces yields and adds significant cost, and therefore, is not entirely satisfactory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
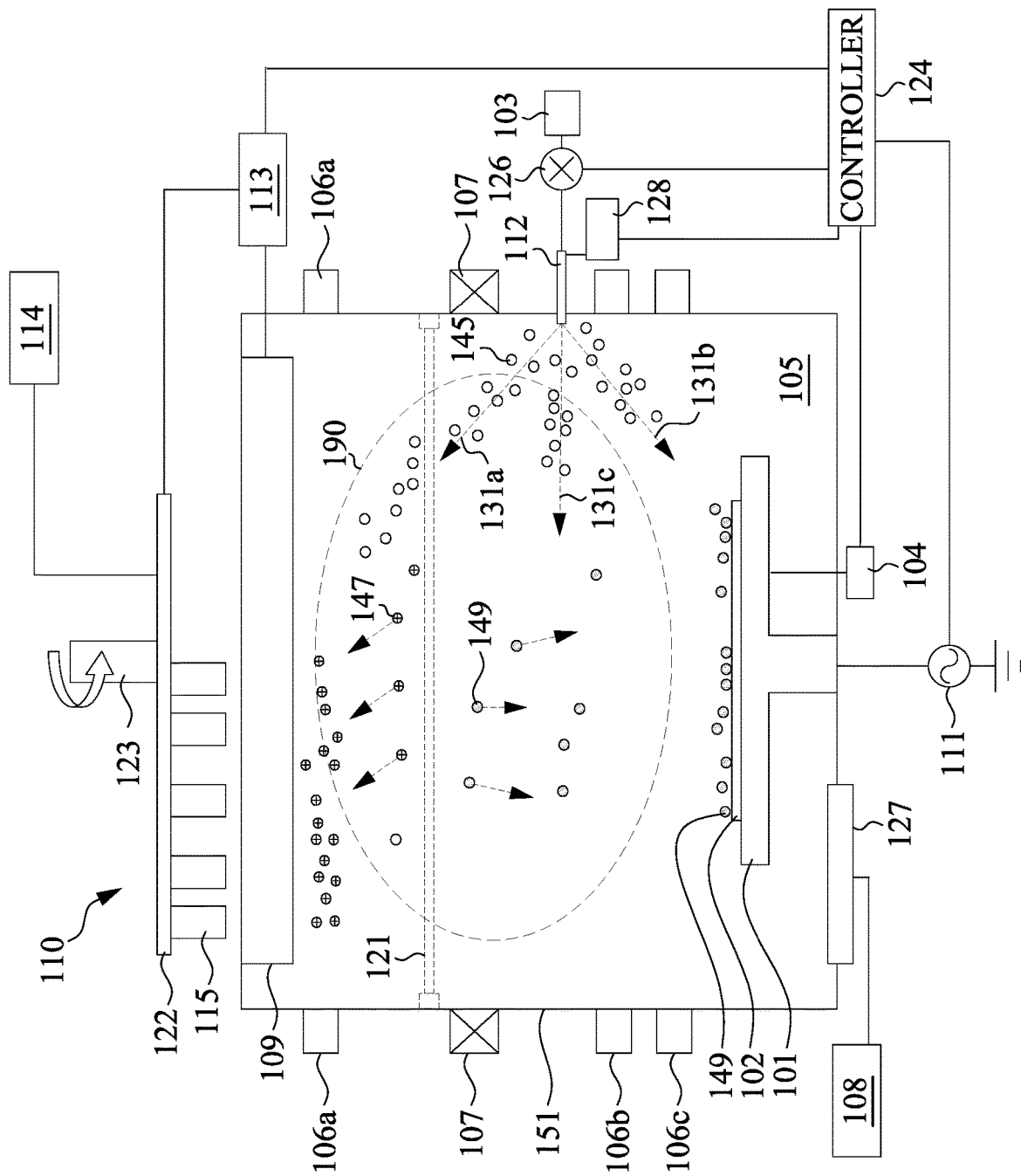
FIG. 1 is a cross-sectional view of a magnetic-controlled reactive sputter system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While embodiments in this disclosure are described in the context of a sputter system for PVD processes, implementations of some aspects of the present disclosure may be used in other processes and/or in other chambers, such as chemical vapor deposition (CVD) chambers, plasma enhanced CVD chambers, atomic layer deposition (ALD) chambers, or any chamber in which gas dissociation and reaction may occur. A person having ordinary skill in the art will readily understand other modifications that may be made are contemplated with the scope of this disclosure.

FIG. 1 is a cross-sectional view of a magnetic-controlled reactive sputter system 100 in accordance with some embodiments. The sputter system 100 may be any suitable PVD system, such as a direct current (DC) magnetron sputter system, a Radio Frequency (RF) capacitively coupled plasma (CCP) sputter system, or an Inductively Coupled Plasma (ICP) sputter system. The sputter system 100 has a chamber 105 defining a space for processing a semiconductor substrate 102. The substrate 102 is disposed on a pedestal 101, which is located on one side of the chamber 105. A target 109 is disposed within the chamber 105 on a side opposite to the pedestal 101. The target 109 is facing the pedestal 101 and separated from the pedestal 101 by a predetermined distance. The target 109 may include any suitable metal and/or metal alloy for use in depositing a layer on the substrate 102. For example, the target 109 may include copper, tungsten, tantalum, tantalum nitride, titanium, copper aluminum alloy, or titanium aluminum alloy.

A DC bias power 113 may be coupled to the target 109 to provide a bias voltage to the target 109. The bias voltage also ionizes a gas provided to the chamber 105 from a gas source 103 and form a plasma 190 in the chamber 105. The bias voltage provided to the target 109 directs ionized species (e.g., ionized gas species 147) in the plasma 190 towards the target 109. A magnetron 110 may be disposed proximate a backside of the target 109. The magnetron 110 has a support 122 attached to a shaft 123. The magnetron 110 is rotated above the target 109 about the shaft 123 using a motor (not shown). Permanent magnets 115 are provided on the support 122 and generate a magnetic field within the chamber 105 near the target 109. The rotation of the magnetron 110, and thus the magnetic field, promote gas ionization near the target 109 and distribute even consumption of the target 109.

The gas source 103 may contain one or more gas sources such as argon, nitrogen, or any high molecular weight gas or chemically inactive noble gas such as xenon. In some embodiments, the gas source 103 is an argon source. The gas source 103 is fluidly connected to a gas injector 112 via a mass flow controller (MFC) 126. The gas injector 112 may be disposed at a sidewall 151 of the chamber 105. The MFC 126 automatically controls the flow rate of the gas flowing to the gas injector 112 according to a pre-set flow rate. A vacuum port 127 is provided on the sidewall 151 of the chamber 105. The vacuum port 127 is connected to a vacuum pump 108 in order to provide low pressure environment in the chamber 105. A foreline (not shown) may be located between the vacuum port 127 and the vacuum pump 108 to abate the exhaust exiting the chamber 105.

In some embodiments where the sputter system 100 is an ICP sputter system, a plurality of coils 106 (106a, 106b, 106c) or plasma ionizers may be disposed on the sidewall 151 of the chamber 105 surround one or more regions between the target 109 and the pedestal 101. In one embodiment, the coils 106 include an upper coil 106a, a middle coil 106b, and a lower coil 106c. The coils 106a, 106b, 106c enhance ionization collision by ionizing the metal atoms (e.g., metal atoms 149) before the metal atoms reach the substrate 102. In some embodiments, the upper, middle, and lower coils 106a, 106b, 106c are coils surrounding the sidewall 151 of the chamber 105. The upper, middle, and lower coils 106a, 106b, 106c may be respectively powered by separate power sources. The plasma created by the upper, middle, and lower coils 106a, 106b, 106c can help ionize the sputtered metal atoms falling from the target 109. The sputtered metal atoms may be ionized under a predetermined frequency and a predetermined pressure. In some embodiments, the sputtered metal atoms 149 are ionized under a high radio frequency between about 13.56 MHz and about 40 MHz, and a pressure between about 1 mTorr and about 150 mTorr. The frequency and pressure may vary to further increase the collision possibility and induce high ion density plasma.

In some embodiments, magnets 107 may be optionally disposed on the sidewall 151 of the chamber 105 surrounding a region between the regions surrounded by the upper coils 106a and the middle coils 106b. The magnets 107 may surround the sidewall 151 of the chamber 105. The magnetic field generated by the magnets 107 can help confine the electrons in the plasma 190 at or near the target 109. Confining the electrons not only leads to a higher density plasma and increased deposition rates, but also prevents damage caused by direct impact of these electrons to the substrate 102 or to the growing layer. The magnets 107 may also have an influence on the distribution of the ion flux to the substrate 102. The magnetic field generated by the coils 106 (e.g., upper coil 106a) in combination with the magnets 107 influences the magnetic field distributed by the rotating permanent magnets 115 of the magnetron 110, while the magnetic field generated by the coils 106 (e.g., middle and lower coils 106b, 106c) confines the plasma and increases plasma bulk density adjacent the substrate 102.

While three coils 106a, 106b, 106c are shown, more or less coils may be employed. In some embodiments, two coils are used and may be disposed on either side of the magnets 107. In some embodiments where the magnets 107 are omitted, two coils, such as upper coil 106a and the middle coil 106b or the lower coil 106c, may be used.

In some embodiments where the sputter system 100 is a RF CCP sputter system, the pedestal 101 may be further connected to a high RF power source 111. In some embodiments, the magnetron 110 can be connected to a high RF power source 114. The high RF power source 111 provides a high RF power, such as RF power operating at a frequency of 13.56 MHz, 40 MHz, or 100 MHz, to the pedestal 101 to capacitively couple the RF energy into the plasma 190. The high RF power source 114 provides a high RF power, such as 13.56 MHz, 40 MHz, or 100 MHz, to the magnetron 110 to capacitively couple the RF energy into the plasma 190. A bias power 104 may be coupled to the pedestal 101 to provide a substrate bias for biasing the substrate 102. The substrate bias attracts the ionized metal atoms from the target 109 to the substrate 102. The ionized atoms may be controlled by the substrate bias to achieve high directional control. For a CCP sputter system, the RF power sources 111 and 114 can be used to provide the ion energy into the plasma. The DC bias power 113 can also be coupled to the magnetron 110 in parallel.

In some embodiments where the sputter system 100 is a DC magnetron sputter system, the RF power may not need to be connected to the magnetron 110. The DC bias power 113 is coupled to the magnetron 110 for ionization and the RF power source 111 is connected to the pedestal 101 for providing the ion energy into the plasma.

A distribution plate 121 may be optionally disposed within the chamber 105 between the target 109 and the pedestal 101. In some embodiments, the distribution plate 121 is disposed between regions surrounded by the upper coil 106a and the magnet 107. The distribution plate 121 includes a plurality of elongated holes spaced along the length of the distribution plate 121 so as to evenly distribute the gas, ionized species and metal atoms within the chamber 105.

In various embodiments, the gas injector 112 is configured to direct the gas (e.g., argon) into predetermined regions in the chamber 105. In some embodiments, the angle of the gas injector 112 can be actively controlled so that the gas stream is provided at an angle of about ±90 degrees with respect to an imaginary horizontal line that is substantially parallel to the top surface of the pedestal 101. In other words, the angle of the gas stream provided by the gas injector 112 may range from about 90 degrees to about −90 degrees with respect to the imaginary line. The angled gas stream injection may be achieved by an angular motion of the gas injector 112, which may be controlled by an actuator 128. The actuator 128 is in electrical communication with the gas injector 112. The angle of the gas injector 112 may be adjusted according to a given recipe, a real-time information of the gas injection and/or reactions in the chamber 105, and/or a process alert (e.g., increased risk of arcing) received by a controller (e.g., controller 124). For example, the recipe may require a greater amount of process gas to be provided to a first region within the chamber 105 than a second region within the chamber 105 that is different than the first region. The real-time information of the gas injection and/or reactions in the chamber 105 may include, but is not limited to, measurement of concentration of process gas at certain regions within the chamber 105, observation or development of undesired or unintended electric arcing at certain regions within the chamber 105, etc. In any case, the angle of the gas injector 112 may be controlled so that the gas stream (indicated by arrow 131a) is either aimed towards the target 109, towards the substrate 102 (e.g., gas stream indicated by arrow 131b), or towards any region in the chamber 105 between the target 109 and the substrate 102 (e.g., gas stream indicated by arrow 131c). The gas may be provided in a continuous manner or in discrete pulses. While the gas injector 112 is shown at an elevation between the magnets 107 and the middle coil 106b, the gas injector 112 may also be disposed between the upper coil 106a and the magnets 107 (FIG. 3), or between the middle coil 106b and the lower coil 106c. Various embodiments of the gas injector 112 are further discussed below with respect to FIGS. 2, 6A-6B, 7A-7B, and 8A-8B.

A programmable controller 124 is provided to control various operations of the sputter system 100 and its associated components discussed in this disclosure. The controller 124 may be a part of or coupled to a computer that is integrated with, coupled to the sputter system 100, otherwise networked to the sputter system 100, or a combination thereof. The controller 124 may be defined as electronics having various integrated circuits, logic, memory, and/or software, and can be programmed to execute a chamber operation defined by a recipe. A given recipe may specify various parameters for the operation, such as the power levels, voltages, frequencies of different power supplies (e.g., DC bias power 113, high RF power source 114, bias power 104, RF power source 111, etc.), the flow rate of gas(es) into the chamber 105, angular motion of the gas injector 112, rotation of the gas injectors 612 (FIGS. 6A-6B to 8A-8B), and the application of vacuum, etc., in accordance with applications. Various embodiments of this disclosure can be fabricated as computer readable code on a computer readable medium. The computer readable medium can include computer readable tangible medium distributed over a local or network-enabled computer system so that the computer readable code is stored and executed by the controller 124 in a distributed fashion.

In operation, a gas, such as argon (Ar) or the like, is provided to the gas injector 112 of the chamber 105 from the gas source 103. The flow rate of the gas is automatically adjusted by the MFC 126 according to a given recipe, real-time information of the gas injection in the chamber 105, and/or process alert received by the controller 124. The angular position of the gas injector 112 is also controlled to provide a gas stream into the chamber 105 with the predetermined directionality, e.g., in a direction towards the target 109 to improve plasma ignition and reduce arcing. Depending on the type of the sputter system, the gas (e.g., gas atom 145) may be ionized by, for example the RF power sources 111, 114 or the DC bias power 113, and the ionized gas species (e.g., ionized gas species 147) are directed to the target 109 by the DC voltage applied to the target 109. The ionized gas species bombard the target 109 to eject metal atoms (e.g., metal atoms 149) from the target 109. The rotation of the magnetic field near the target 109 increases the density of ionized gas species 147 proximate the target 109 and therefore the efficiency of the bombardment. The metal atoms having a neutral charge fall towards the substrate 102 and deposit a layer on the surface of the substrate 102.

Figure 2:
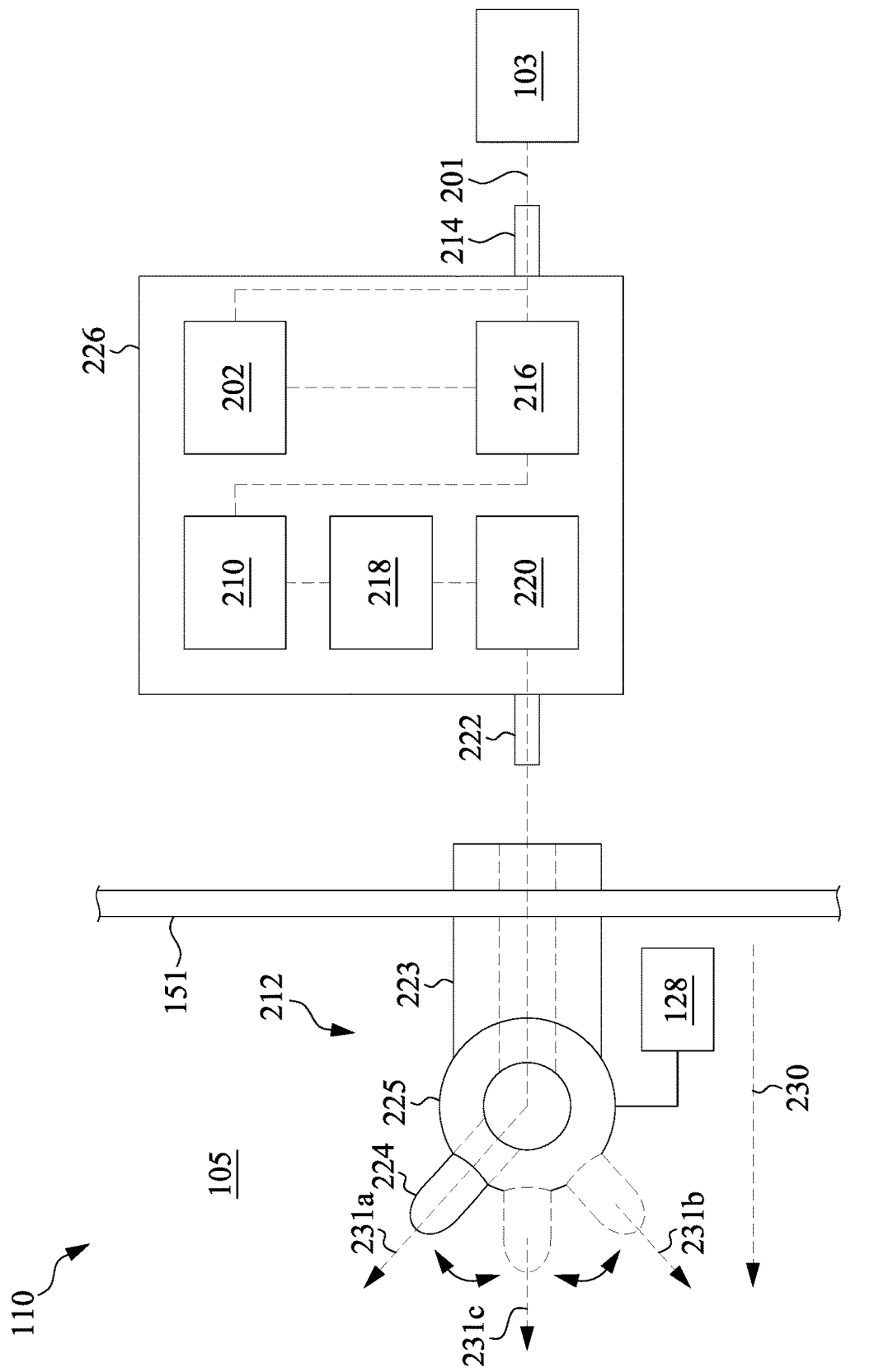
FIG. 2 is a schematic view illustrating the injection of a gas into the chamber in accordance with some embodiments.

FIG. 2 is a schematic view illustrating the injection of a gas into the chamber 105 in accordance with some embodiments. A gas (represented by a dotted line 201) is provided from the gas source 103 to a mass flow controller (MFC) 226 and then to a gas injector 212. Piping may be omitted for clarification. The MFC 226 and the gas injector 212 and may be used to replace the MFC 126 and the gas injector 112 shown in FIG. 1. The MFC 226 may include an inlet 214, an outlet 222, a mass flow sensor 202, an electronic controller 210, a bypass channel 216, and an outlet control valve 220. In operation, the gas 201 entering from the inlet 214 proceeds through the bypass channel 216. A small amount of the gas 201 is diverted through the mass flow sensor 202 and re-enters the bypass channel 216. The mass flow sensor 202 measures the mass flow rate of the gas 201 to obtain a measured flow signal. The electronic controller 210 compares the measured flow signal and the external flow rate setting signal and provides a difference signal to the outlet control valve 220. The outlet control valve 220 is operated to modify the flow rate so that the difference between the measured flow signal and the external flow rate setting signal is zero, thereby providing a controlled mass flow of the gas to the outlet 222.

The controlled mass flow of the gas 201 existing the outlet 222 is introduced into the chamber 105 via the gas injector 212. The gas injector 212 may be made of metal such as aluminum or stainless steel, or dielectric material such as quartz, alumina, silicon nitride, silicon carbide, etc. The gas injector 212 is fluidly connected with the MFC 226. In some embodiments, the gas injector 212 may have a gas delivery member 223, a rotary member 225, and a gas outlet 224. The angle of the gas injector 212 can be actively controlled before or during the process so that the gas stream is provided at an angle of about ±90 degrees with respect to a longitudinal center axis of the gas delivery member 223. The gas delivery member 223 may have a body extending through the sidewall 151 of the sputter system 100. The longitudinal center axis is parallel to an imaginary horizontal line 230, which is parallel to the top surface of a pedestal (not shown), such as the pedestal 101 shown in FIG. 1. In some embodiments, the gas injector 212 is configured to be pivoted around its two axes. That is, the gas injector 212 can provide angular movement along two axes (e.g., vertical and horizontal movement) with respect to the imaginary horizontal line 230. The angular motion of the gas injector 212 is achieved by the actuator 128, which may include a motor, rotor, a pivoting member, or any combination thereof.

The gas delivery member 223 is fluidly connected, either directly or indirectly, with the outlet 222 of the MFC 226. The rotary member 225 is coupled to and in fluid communication with the gas delivery member 223 and the gas outlet 224, respectively. The actuator 128 controls the rotary member 225 to adjust the angle of the gas outlet 224 according to a given recipe and/or real-time information of the gas injection and/or reactions in the chamber 105, which may require greater amount of gas near a target (e.g., target 109 in FIG. 1) for better gas ionization, plasma formation, and/or bombardment efficiency, or greater amount of gas near a substrate (e.g., substrate 102 in FIG. 1) to enhance plasma density adjacent the substrate. Additionally or alternatively, in some embodiments, the angle of the gas injector 212 is adjusted according to a process alert (e.g., increased risk of arcing) sent from a measuring tool to a controller (e.g., controller 124).

In either case, the gas injector 212 is controlled so that the gas outlet 224 of the gas injector 212 is directed to provide a gas stream (indicated by arrow 231a) aiming at an upper region of the chamber 105 (e.g., region near a target), a gas stream (indicated by arrow 231b) aiming at a lower region of the chamber 105 (e.g., region near a pedestal), or a gas stream (indicated by arrow 231c) aiming at a center region between the upper region of the lower region. In various cases, the gas outlet 224 of the gas injector 212 is controlled so that the directionality of the gas outlet 224 is adjustable and movable within an angular range of about −90 degree to about 90 degrees, either vertically or horizontally, with respect to the imaginary horizontal line 230, and such an angular motion can be made by the actuator 128 before, during, and/or after the process. The gas stream can be provided with an adjustable directionality and controlled mass flow to fine tune gas volume (e.g., increase argon concentration in the plasma) in the chamber 105 in response to any observed issues (e.g., arcing) or potential risks associated with the process in a real-time manner.

In some embodiments, the gas outlet 224 may be directed to provide a first direction of a gas stream during a first period of time and a second direction of the gas stream during a second period of time, wherein the second direction is different from the first direction, and the first period of time may be the same or different from the second period of time. The gas steam may be provided into the chamber 105 in discrete pulses or in a continuous manner. In some embodiments, the gas outlet 224 may be directed to provide a first direction of a gas stream in a continuous manner during a first period of time and a second direction of the gas stream in discrete pulses during a second period of time, or vice versa. In some embodiments, the direction of the gas stream, or the position of the gas outlet 224, may be changed during the deposition of a layer on a substrate, such as the substrate 102 (FIG. 1).

Figure 3:
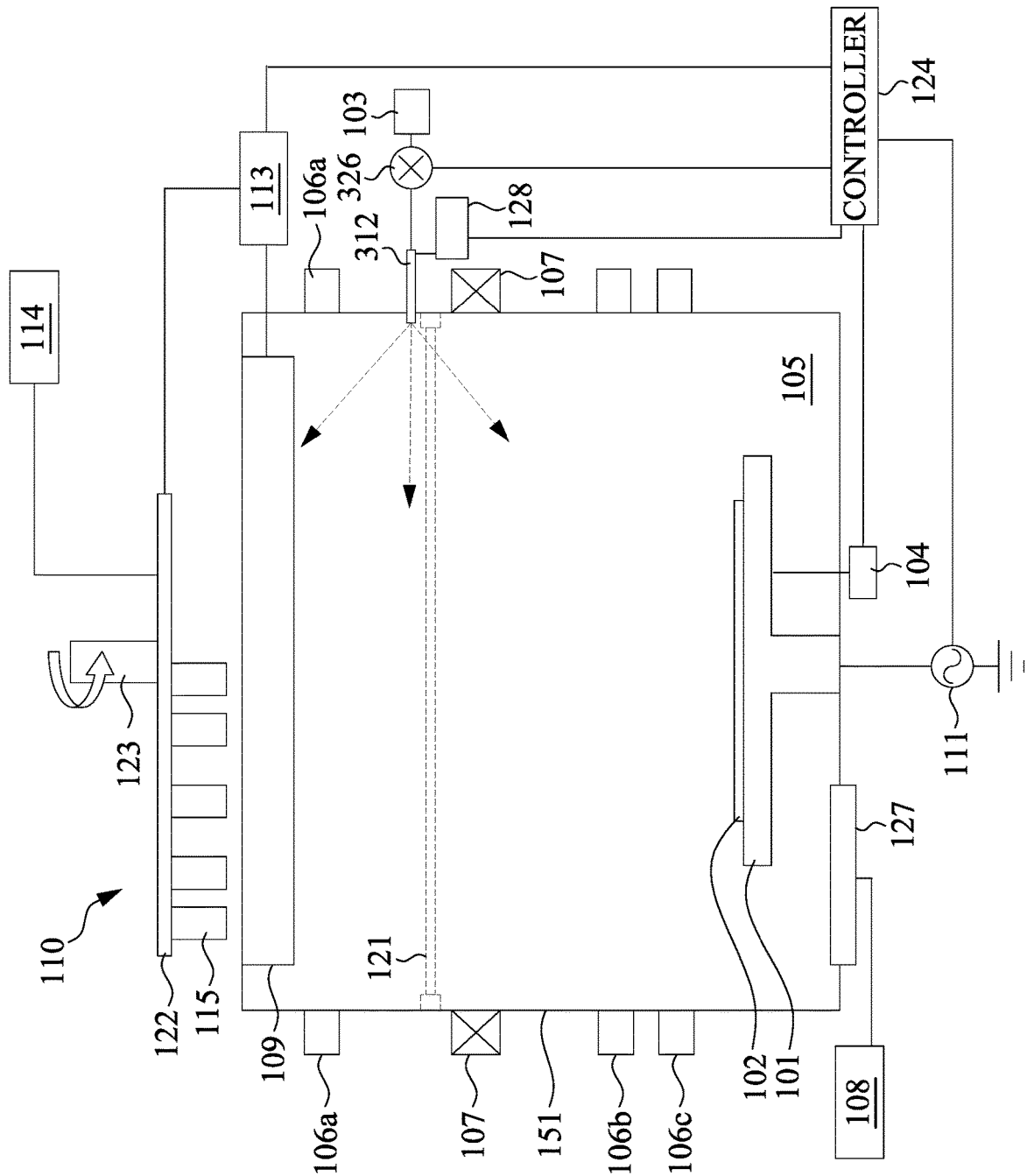
FIG. 3 is a cross-sectional view of a magnetic-controlled reactive sputter system in accordance with some embodiments.

FIG. 3 is a cross-sectional view of a magnetic-controlled reactive sputter system 300 in accordance with some embodiments. The sputter system 300 is substantially identical to the sputter system 100 except that a gas injector 312, which can be the gas injector 112, 212 discussed above, is disposed at a higher elevation closer to the target 109. In one embodiment, the gas injector 312 is disposed at the sidewall 151 between the upper coil 106a and the magnets 107. The distribution plate 121 may be optionally provided within the chamber 105 at any suitable location, such as between the upper coil 106a and the magnets 107 or between the magnets 107 and the middle coil 106b.

Figure 4:
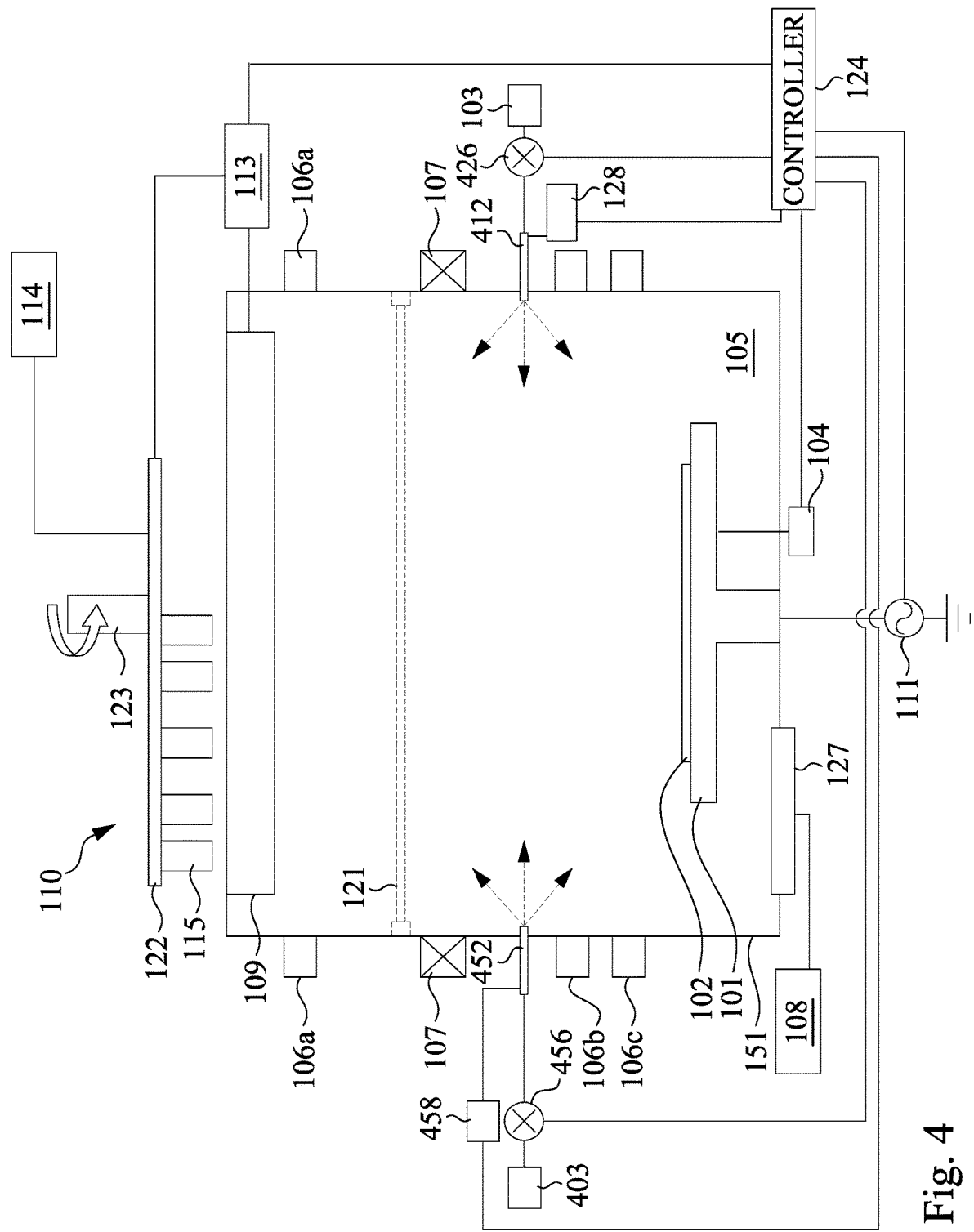
FIG. 4 is a cross-sectional view of a magnetic-controlled reactive sputter system in accordance with some embodiments.

FIG. 4 is a cross-sectional view of a magnetic-controlled reactive sputter system 400 in accordance with some embodiments. The sputter system 400 is substantially identical to the sputter system 100 except that a first gas injector 412 and a second gas injector 512 are disposed on opposing sides of the chamber 105. The first and second gas injectors 412, 512 can be the gas injector 212 discussed above with respect to FIGS. 1 and 2. The first gas injector 412 is fluidly connected to the gas source 103 via a first MFC 426. Likewise, the second gas injector 512 is fluidly connected to a gas source 453 via a second MFC 456. The first and second MFCs 426, 456 can be the MFC 226 discussed above in FIG. 2, and the gas source 403 can include the same or different gas sources from the gas source 103. The angular motion of the first gas injector 412 and the second gas injector 512 are controlled by the actuator 128, and a second actuator 458, respectively. The actuator 128 and the second actuator 458 function similarly and can be operated to adjust the directionality of the first and second gas injectors 412, 512. The gas outlet (not shown) of each first and second gas injectors 412, 512 is individually and actively controlled during the process so that the gas stream from the first and second gas injectors 412, 512 is provided at an angle of about ±90 degrees with respect to an imaginary horizontal line that is parallel to the top surface of the pedestal 101. The gas steam may be provided in a continuous manner or in discrete pulses. In some embodiments where the gas steam is provided in discrete pulses, the first and second gas injectors 412, 512 may each have a duty cycle of between about 10% and about 90%, and the duty cycle of the first and second gas injectors 412, 512 can be the same or different.

While the first and second gas injector 412, 512 are shown at an elevation between the magnets 107 and the middle coil 106b, the first and second gas injector 412, 512 may be disposed between the upper coil 106a and the magnets 107, or between the middle coil 106b and the lower coil 106c.

Figure 5:
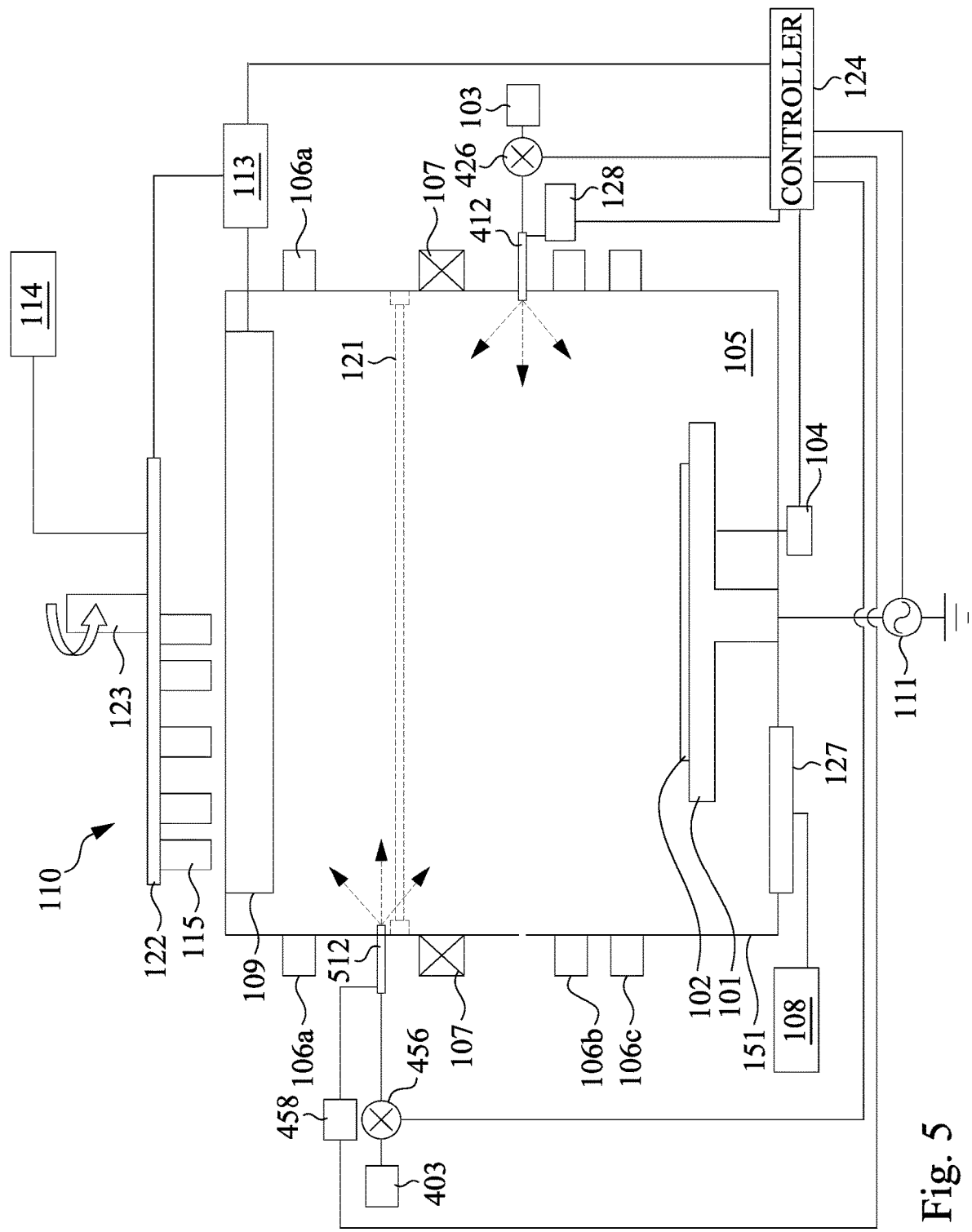
FIG. 5 a cross-sectional view of a magnetic-controlled reactive sputter system in accordance with some embodiments.

FIG. 5 a cross-sectional view of a magnetic-controlled reactive sputter system 500 in accordance with some embodiments. The sputter system 500 is substantially identical to the sputter system 400 except that the second gas injector 512 is disposed at an elevation different than the first gas injector 412. In some embodiments, the second gas injector 512 is disposed higher than the first gas injector 412. In one aspect, the second gas injector 512 is disposed at an elevation between the upper coil 106a and the magnets 107, while the first gas injector 412 is disposed between the magnets 107 and the middle coil 106b. The first and second gas injector 412, 512 may be operated similarly as discussed above with respect to FIG. 4 to provide gas streams to desired regions in the chamber 105.

Figure 6A:
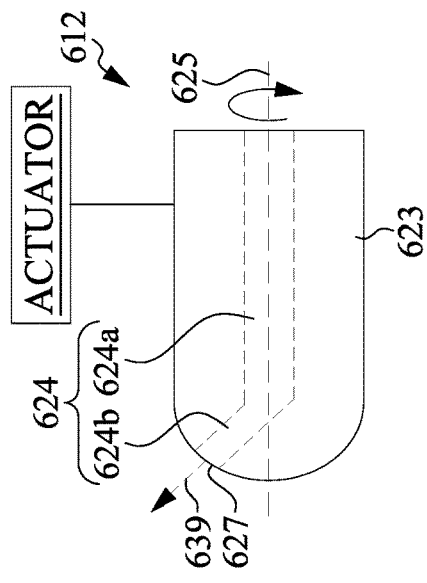
FIGS. 6A-6B to 8A-8B are cross-sectional and front views of a portion of a gas injector in accordance with some embodiments.
Figure 6B:
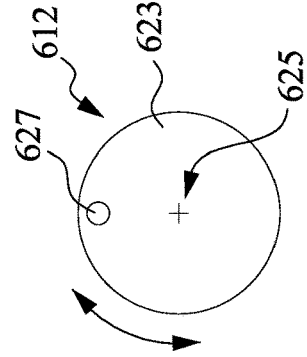

FIGS. 6A-6B to 8A-8B are cross-sectional and front views of a portion of a gas injector in accordance with some embodiments. Unlike the gas injectors 112, 212, which provide two axes of movement (e.g., vertical movement and horizontal movement), various embodiments of the gas injectors in FIGS. 6A-6B to 8A-8B rotates about a center axis the gas injector. In the embodiment of FIGS. 6A and 6B, a gas injector 612 may include a gas delivery member 623 and a gas channel 624 extended through the body of the gas delivery member 623. The gas injector 612 may have a dome profile at one end. In some embodiments, the gas channel 624 has a first portion 624a and a second portion 624b branching off from an end of the first portion 624a. The second portion 624b is at an angle (greater than zero) with respect to the first portion 624a. In some embodiments, the angle (e.g., inner angle between the first and second portions 624a, 624b) is in a range from about 110° to about 170°. The first portion 624a is in fluid communication with a gas source, such as the gas source 103, 403. The second portion 624b has a first end fluidly connected to the first portion 624a and a second end, which is an opening 627 at the dome profile of the gas injector 612, leading to a chamber of a sputter system (e.g., chamber 105 of the sputter system 100). As can be seen in FIG. 6B, the opening 627 may be at a location away from a longitudinal center axis 625 of the gas injector 612. For example, the opening 627 may be at a periphery of the gas delivery member 623.

The gas delivery member 623 is rotatable about the longitudinal center axis 625 of the gas injector 612. The rotation of the gas delivery member 623 may be achieved by an actuator, which may be a part of the gas injector 612 or in electrical communication with the gas injector 612. The actuator may be a rotational actuator including a motor, rotor, or the like, or any combination thereof. Since the opening 627 is at the periphery of the gas delivery member 623, rotation of the gas delivery member 623 allows the gas channel 624 to provide a gas steam (indicated by an arrow 639) aiming at different regions in the chamber 105. For example, the gas delivery member 623 may be rotated to a first position, for a first period of time, where the opening 627 of the gas channel 624 is pointing to a region near a target (e.g., target 109 in FIG. 1) for better gas ionization, plasma formation, and/or bombardment efficiency. The gas delivery member 623 may be rotated to a second position, for a second period of time, where the opening 627 is pointing to a region near a substrate (e.g., substrate 102 in FIG. 1) to enhance plasma density adjacent the substrate. The first period of time may be the same or different from the second period of time. In some embodiments, the gas stream may be provided in a continuous manner during the first period of time and in discrete pulses during the second period of time, or vice versa. The actuator may rotate the gas delivery member 623 at about 10 revolutions-per-minute (RPM) to about 200 RPM, depending on the application.

The gas delivery member 623 can be rotated 360° about the longitudinal center axis 625, allowing a full coverage of gas distribution in the chamber. The rotation of the gas delivery member 623 can be adjusted according to a given recipe, a real-time information of the gas injection and/or reactions in the chamber, and/or a process alert (e.g., increased risk of arcing) received by a controller (e.g., controller 124).

Figure 7A:
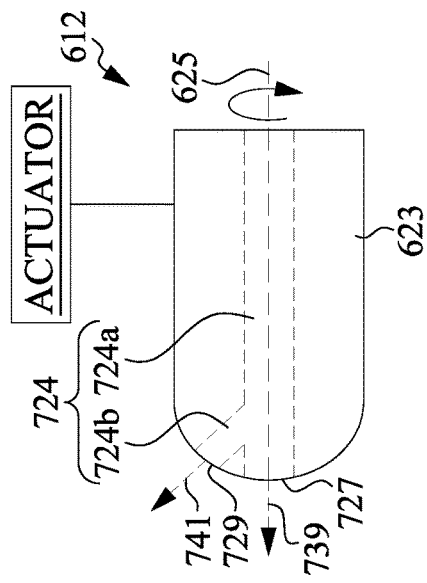
Figure 7B:
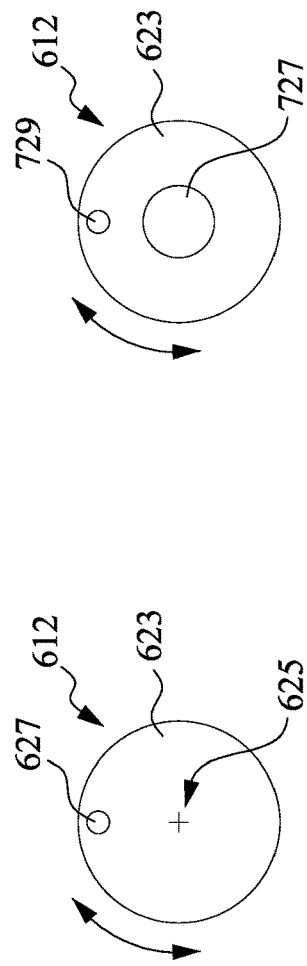

In the embodiment of FIGS. 7A and 7B, the gas injector 612 is substantially identical to the gas injector 612 of FIGS. 6A and 6B except that a gas channel 724 has a first portion 724a extending through the body of the gas delivery member 623 and a second portion 724b branching off from the first portion 724a. In some embodiments, the first portion 724a may have a first diameter and the second portion 724b may have a second diameter smaller than the first diameter, or vice versa. The second portion 724b is at an angle (greater than zero) with respect to the first portion 724a. The first portion 724a is co-axial with the longitudinal center axis 625 and has an opening 727 at the dome profile of the gas injector 612 leading to the chamber. The second portion 724b has an opening 729 at a location away from the longitudinal center axis 625 of the gas injector 612. For example, the opening 729 may be at a periphery of the gas delivery member 623. In this embodiment, the rotation of the gas delivery member 623 allows a first gas stream (indicated by an arrow 739) to be provided to a first zone in the chamber along a first direction, and a second gas stream (indicated by an arrow 741) to be provided to a second zone in the chamber along a second direction that is different from the first direction.

Figure 8A:
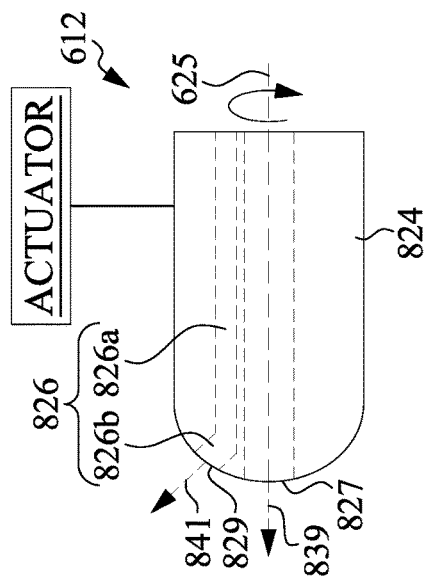
Figure 8B:
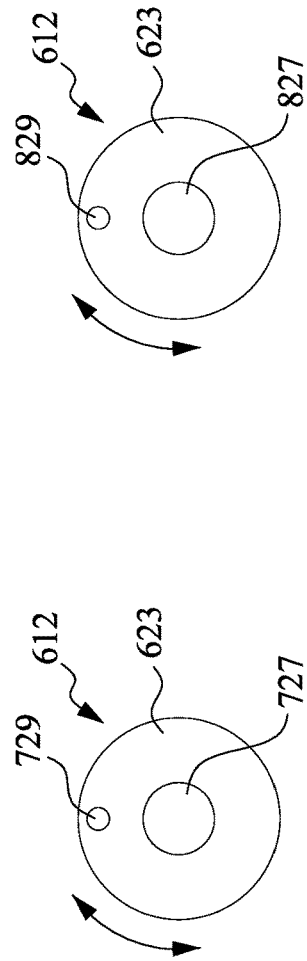

In the embodiment of FIGS. 8A and 8B, the gas injector 612 is substantially identical to the gas injector 612 of FIGS. 6A and 6B except that first and second gas channels 824, 826 are provided in the body of the gas delivery member 623. The first and second gas channels 824, 826 are independent from each other, and each of the first and second gas channels 824, 826 may introduce the same or different gases into the chamber. The first gas channel 824 is co-axial with the longitudinal center axis 625 and has an opening 827 at the dome profile of the gas injector 612 leading to the chamber. The second gas channel 826 is at a location away from the longitudinal center axis 625 of the gas injector 612. For example, the second gas channel 826 may be at a periphery of the gas delivery member 623. The second gas channel 826 extends through the body of the gas delivery member 623 and has a first portion 826a and a second portion 826b branching off from an end of the first portion 826a. The second portion 826b has an opening 829 at the dome profile of the gas injector 612 leading to the chamber. In some embodiments, the first portion 826a may have a first diameter and the second portion 826b may have a second diameter smaller than the first diameter, or vice versa. The second portion 826b is at an angle (greater than zero) with respect to the first portion 826a. In some embodiments, the angle (e.g., inner angle between the first and second portions 826a, 826b) is in a range from about 110° to about 170°. Alternatively, the second gas channel 826 may be made straight and parallel to the first gas channel 824 without the second portion 826b. In this embodiment, the rotation of the gas delivery member 623 allows a first gas stream (indicated by an arrow 839) to be provided to a first zone in the chamber along a first direction, and a second gas stream (indicated by an arrow 841) to be provided to a second zone in the chamber along a second direction that is different from the first direction. Depending on the application, the first gas stream 839 and the second gas stream 841 may be the same or different gases, and each first and second gas stream 839, 841 may be provided to the chamber at different flow rates.

Various embodiments of the gas injectors in FIGS. 6A-6B to 8A-8B can be combined with one or more embodiments discussed above with respect to FIGS. 1 to 5.

Figure 9:
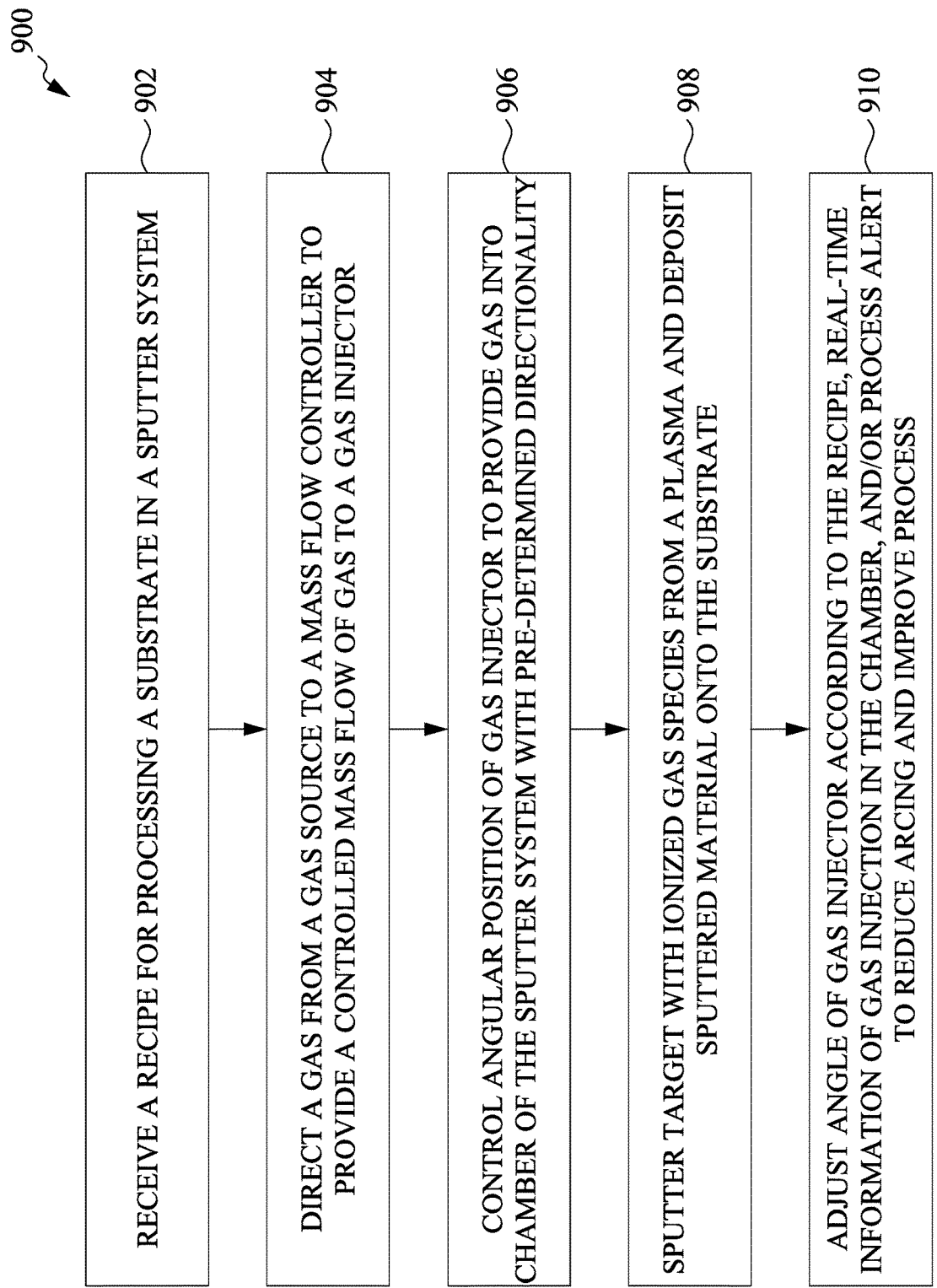
FIG. 9 is a flowchart of an algorithm for processing a substrate in a semiconductor manufacturing system, in accordance with some embodiments.

FIG. 9 is a flowchart of an algorithm for processing a substrate in a semiconductor manufacturing system, such as the sputter system 100 in FIG. 1, in accordance with some embodiments. While various operations in this flowchart are described sequentially, some or all of the operations may be executed in a different order, be combined or omitted, or be executed in parallel.

At operation 902, a recipe is received by a controller (e.g., controller 124 in FIG. 1) for processing a substrate in a sputter system (e.g., sputter system 100 in FIG. 1). The recipe may specify various operations and process parameters for depositing a layer on a substrate (e.g., substrate 102 in FIG. 1).

At operation 904, the controller directs a gas, such as argon, from a gas source (e.g., gas source 103 in FIG. 1) to a mass flow controller (e.g., MFC 126/226 in FIGS. 1 and 2) where a controlled mass flow of the gas is provided to a gas injector (e.g., gas injector 112/212/312/412/512/612 in FIGS. 1-8B).

At operation 906, the controller adjusts an angular/rotational position of the gas injector and directs the gas into a chamber (e.g., chamber 105 in FIG. 1) of the sputter system with a predetermined directionality.

At operation 908, the controller directs RF power applied to a pedestal (e.g., pedestal 101 in FIG. 1) and a magnetron (e.g., magnetron 110 in FIG. 1), or DC power applied to a target (e.g., target 109 in FIG. 1), to ionize the gas and form a plasma. The ionized gas species from the plasma bombard or collide with the target and the material sputtered from the target deposits a layer on the substrate.

At operation 910, the controller adjusts the angle/rotation of the gas injector according to the given recipe, real-time information of the gas injection and/or reactions in the chamber, and/or process alert received by the controller. The controller may adjust the angle/rotation of the gas injector so that the gas is provided to an upper region of the chamber (e.g., region near the target), a lower region of the chamber (e.g., region near the pedestal), or a center region between the upper region of the lower region, thereby improving plasma ignition, improving bombardment efficiency, reducing arcing, and/or enhancing plasma density adjacent the substrate. The angular and/or rotational adjustment of the gas injector may be made before, during, and/or after the process, and such angular and/or rotational adjustment may be made continuously during the process to fine tune gas volume (e.g., increase argon concentration in the plasma) and directionality in the chamber in response to any observed issues or potential alerts in a real-time manner.

Various embodiments of the present disclosure provide a sputter system with an improved gas injector that is fluidly connected with a mass flow controller. The gas injector is configured to provide at least two axes of movement (e.g., vertical and horizontal movement), allowing the gas to be provided to a chamber of the sputter system with controlled mass flow and adjustable directionality to fine tune gas volume in the chamber in a real-time manner. The angular and/or rotational adjustment of the gas injector is made during the process for better gas ionization, plasma formation, bombardment efficiency, arcing prevention, and/or enhanced plasma density adjacent the substrate. As a result, the deposition process is improved with less defects.

Embodiments of the present disclosure provide a substrate processing system. In one embodiment, the system includes a chamber, a target disposed within the chamber, a magnetron disposed proximate the target, a pedestal disposed within the chamber, and a first gas injector disposed at a sidewall of the chamber. The first gas injector includes a first gas channel extending through a body of the first gas injector, the first gas channel has a first gas outlet. The first gas injector also includes a second gas channel extending through the body of the first gas injector, wherein the second gas channel has a second gas outlet. The second gas channel includes a first portion, and a second portion branching off from an end of the first portion, wherein the second portion is disposed at an angle with respect to the first portion, and the first gas injector is operable to rotate about a longitudinal center axis of the body of the first gas injector.

Another embodiment is a gas injector for use in a physical vapor deposition (PVD) chamber. The gas injector includes a gas delivery member and a gas channel extending through the gas delivery member. The gas channel includes a first portion leading to a first gas outlet of the gas delivery member, and a second portion has a first end fluidly connected to the first portion and a second end leading to a second gas outlet of the gas delivery member, wherein the second portion is branched off from the first portion and disposed at an angle with respect to the first portion, and the gas delivery member is operable to rotate about a longitudinal center axis of the gas delivery member.

A further embodiment is a method for processing a substrate. The method includes directing a gas from a gas delivery member to a processing chamber in which a substrate is disposed, forming a plasma from the gas, depositing a layer on the substrate by a physical vapor deposition (PVD) process, and adjusting angularity and/or rotation of the gas delivery member so that the gas is provided to different zones of the processing chamber to improve the PVD process based on a real-time information of gas injection and/or reactions in the processing chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A substrate processing system, comprising:
   a chamber;
   a target disposed within the chamber;
   a magnetron disposed proximate the target;
   a pedestal disposed within the chamber; and
   a first gas injector disposed at a sidewall of the chamber, the first gas injector comprises:
      a first gas channel extending through a body of the first gas injector, the first gas channel has a first gas outlet; and
      a second gas channel extending through the body of the first gas injector, the second gas channel has a second gas outlet, the second gas channel comprising:
         a first portion; and
         a second portion branching off from an end of the first portion, wherein the second portion is disposed at an angle with respect to the first portion, and the first gas injector is operable to rotate about a longitudinal center axis of the body of the first gas injector.

2. The system of claim 1, wherein the second gas outlet is operable to move vertically and horizontally with respect to an imaginary horizontal line parallel to a top surface of the pedestal.

3. The system of claim 2, wherein the first and second gas outlets are operable to move during a physical vapor deposition (PVD) process.

4. The system of claim 1, further comprising:
   a mass flow controller (MFC) fluidly connected to the first gas injector.

5. The system of claim 4, wherein the first gas injector is operable to provide a gas flow in a continuous manner or in discrete pulses.

6. The system of claim 4, further comprising:
   a magnet surrounding the sidewall; and
   a first coil disposed below the magnet and surrounding the sidewall.

7. The system of claim 6, further comprising:
   a second coil disposed above the magnet and surrounding the sidewall.

8. The system of claim 6, wherein the first gas injector is disposed between the magnet and the first coil.

9. The system of claim 2, further comprising:
   a second gas injector disposed at the sidewall opposing the first gas injector, wherein the second gas injector has a gas outlet that is operable to move vertically and horizontally.

10. A gas injector for use in a physical vapor deposition (PVD) chamber, comprising:
    a gas delivery member; and
    a gas channel disposed entirely within and extending through the gas delivery member, and the gas channel comprises:
       a first portion leading to a first gas outlet of the gas delivery member, the first portion having a first diameter; and
       a second portion has a first end fluidly connected to the first portion and a second end leading to a second gas outlet of the gas delivery member, the second portion having a second diameter different than the first diameter, wherein the second portion is branched off from the first portion and disposed at an angle with respect to the first portion, and the gas delivery member is operable to rotate about a longitudinal center axis of the gas delivery member.

11. The gas injector of claim 10, wherein the angle is in a range from about 110° to about 170°.

12. The gas injector of claim 10, wherein the first gas outlet is disposed at a center of the gas delivery member and the second gas outlet is disposed at a periphery of the gas delivery member.

13. The gas injector of claim 10, wherein the gas delivery member is operable to provide a gas flow in a continuous manner or in discrete pulses.

14. The gas injector of claim 10, wherein the gas delivery member is operable to rotate so that the second gas outlet is moved to a first position for a first period of time and a second position for a second period of time.

15. The gas injector of claim 14, wherein the first period of time is the same or different than the second period of time.

16. The gas injector of claim 14, wherein the gas delivery member is fluidly connected to a mass flow controller (MFC).

17. A method for processing a substrate, comprising:
directing a gas from a gas delivery member to a processing chamber in which a substrate is disposed;
forming a plasma from the gas;
depositing a layer on the substrate by a physical vapor deposition (PVD) process; and
adjusting angularity and/or rotation of the gas delivery member so that the gas is provided to different zones of the processing chamber to improve the PVD process based on a real-time information of gas injection and/or reactions in the processing chamber.

18. The method of claim 17, further comprising:
flowing the gas from a gas source to the gas delivery member through a mass flow controller (MFC).

19. The method of claim 17, wherein directing a gas from a gas delivery member to a processing chamber further comprises:
flowing the gas to a first portion of a gas channel in the gas delivery member;
flowing the gas from the first portion of the gas channel to a second portion of the gas channel, wherein the second portion is disposed at an angle with respect to the first portion; and
rotating the gas delivery member.

20. The method of claim 17, wherein directing a gas from a gas delivery member to a processing chamber further comprises:
flowing the gas to a first gas channel in the gas delivery member, wherein the first gas channel extends through the gas delivery member and has a first gas outlet disposed at a longitudinal center axis of the gas delivery member;
flowing the gas to a second gas channel in the gas delivery member, wherein the second gas channel extends through the gas delivery member and has a second gas outlet disposed at a periphery of the gas delivery member; and
rotating the gas delivery member.

* * * * *